United States Patent
Roy et al.

(10) Patent No.: US 8,735,208 B2
(45) Date of Patent: May 27, 2014

(54) METHOD FOR FORMING A BACK-SIDE ILLUMINATED IMAGE SENSOR

(75) Inventors: François Roy, Seyssins (FR); Michel Marty, Saint Paul de Varces (FR)

(73) Assignees: STMicroelectronics S.A., Montrouge (FR); STMicroelectronics (Crolles 2) SAS, Crolles (FR)

( * ) Notice: Subject to any disclaimer, the term of this patent is extended or adjusted under 35 U.S.C. 154(b) by 0 days.

(21) Appl. No.: 13/445,265

(22) Filed: Apr. 12, 2012

(65) Prior Publication Data

US 2012/0261784 A1  Oct. 18, 2012

(30) Foreign Application Priority Data

Apr. 12, 2011  (FR) ...................................... 11 53178

(51) Int. Cl.
 *H01L 31/18* (2006.01)
(52) U.S. Cl.
 USPC ............... 438/73; 438/57; 257/228; 257/460; 257/E31.054
(58) Field of Classification Search
 USPC ................................ 257/228, 460; 438/57, 73
 See application file for complete search history.

(56) References Cited

U.S. PATENT DOCUMENTS

| | | | |
|---|---|---|---|
| 2,200,084 A | | 5/1940 | Hibbard |
| 4,503,087 A | * | 3/1985 | Russo ............................. 438/14 |
| 7,875,918 B2 | | 1/2011 | Venezia et al. |
| 2007/0052056 A1 | | 3/2007 | Doi et al. |
| 2009/0315132 A1 | | 12/2009 | Kohyama |
| 2010/0123069 A1 | | 5/2010 | Mao et al. |
| 2010/0148289 A1 | | 6/2010 | McCarten et al. |
| 2010/0193845 A1 | | 8/2010 | Roy et al. |
| 2010/0237451 A1 | | 9/2010 | Murakoshi |
| 2011/0266645 A1 | * | 11/2011 | Chao ............................. 257/432 |
| 2012/0248560 A1 | * | 10/2012 | Lee et al. ...................... 257/432 |

FOREIGN PATENT DOCUMENTS

| | | |
|---|---|---|
| EP | 1995783 A2 | 11/2008 |
| WO | WO 2009023603 A1 | 2/2009 |

OTHER PUBLICATIONS

French Search Report and Written Opinion dated Sep. 15, 2011 from corresponding French Application No. 11/53178.
French Search Report and Written Opinion dated Sep. 14, 2011 from related French Application No. 11/53183.
French Search Report and Written Opinion dated Sep. 14, 2011from related French Application No. 11/53179.
French Search Report and Written Opinion dated Sep. 12, 2011 from related French Application No. 11/53177.

* cited by examiner

*Primary Examiner* — Cheung Lee
*Assistant Examiner* — Stephen Bradley
(74) *Attorney, Agent, or Firm* — Wolf, Greenfield & Sacks, P.C.

(57) ABSTRACT

A method for forming a back-side illuminated image sensor from a semiconductor substrate, including the steps of: a) forming, from the front surface of the substrate, areas of same conductivity type as the substrate but of higher doping level, extending deep under the front surface, these areas being bordered with insulating regions orthogonal to the front surface; b) thinning the substrate from the rear surface to the vicinity of these areas and all the way to the insulating regions; c) partially hollowing out the insulating regions on the rear to surface side; and d) performing a laser surface anneal of the rear surface of the substrate.

11 Claims, 2 Drawing Sheets

METHOD FOR FORMING A BACK-SIDE ILLUMINATED IMAGE SENSOR

CROSS REFERENCE TO RELATED APPLICATIONS

This application claims the priority benefit of French patent application Ser. No. 11/53178 filed on Apr. 12, 2011, entitled METHOD FOR FORMING A BACK-SIDE ILLUMINATED IMAGE SENSOR, which is hereby incorporated by reference to the maximum extent allowable by law.

BACKGROUND

1. Technical Field

Embodiments relate to a method for forming a back-side illuminated image sensor. Embodiments also aim at a sensor formed according to this method.

2. Discussion of the Related Art

FIG. 1 is a cross-section view schematically and partially showing a back-side illuminated image sensor 1. To form such a sensor, it is started from a semiconductor substrate of standard thickness, for example, a few hundreds of μm, which is thinned from its rear surface to provide a substrate 3 having a thickness ranging from a few micrometers to some ten micrometers. The initial substrate may be a substrate of semiconductor-on-insulator type, a solid silicon substrate possibly coated with an epitaxial layer, or any other type of semiconductor substrate capable of being thinned from its rear surface. In the present example, substrate 3 is of type P.

Before the thinning step, insulating regions 5 forming vertical partitions are formed in the upper portion of the substrate. Regions 5 extend in the substrate, from its front surface and perpendicularly to this surface, down to an intermediary depth, for example, of a few micrometers. In top view (not shown), regions 5 delimit a plurality of rectangular substrate portions 3a and 3b. Each portion 3a is intended to comprise at least one photodiode (not shown), corresponding to a pixel of the sensor, and each portion 3b is intended to comprise one or several control transistors (not shown). To form insulating regions 5, openings in the form of trenches are etched into the substrate down to the desired depth, and filled with an insulating material such as silicon oxide. After the etching, but before the filling, dopant elements are implanted from the internal walls of the trenches, to create, at the interface between substrate 3 and insulator 5, a thin layer 7 of same conductivity type as the substrate but of higher doping level. Layer 7 especially enables to limit so-called dark currents, which are parasitic currents capable of appearing even in the absence of any illumination of the sensor and of being collected by the photodiodes. Dark currents are due to the spontaneous random generation of electron-hole pairs at the level of defects of the crystal structure of the substrate. In particular, at the interface between substrate 3 and insulator 5, crystal defects created on opening of the trenches are capable of generating dark currents. The provision of layer 7 enables to both significantly decrease the electron generation rate close to the interface, and increase the probability, when an electron is generated close to the interface, for the latter to be recombined to with a hole and thus not to be collected by a photodiode.

After the forming of insulating regions 5, photodiodes and charge transfer devices (not shown) are formed in the upper portion of substrate portions 3a, and control transistors (not shown) are formed inside and on top of substrate portions 3b. The control transistors of a substrate portion 3b may be shared between several neighboring photodiodes, for example between four photodiodes associated with four neighboring substrate portions 3a.

The front surface of substrate 3 is then coated with a stack 9 of insulating and conductive layers where the various sensor interconnections are formed. In particular, each substrate portion 3a or 3b is topped with a biasing contacting area 11 formed in stack 9. Each area 11 contacts a P-type region 13 of higher doping level than the substrate, formed in the upper portion of the corresponding substrate portion 3a or 3b. The interconnection tracks and vias, other than those forming areas 11, have not been shown in FIG. 1.

After the forming of stack 9, a holding handle (not shown) is bonded to the upper surface of the sensor, and the substrate is thinned from its rear surface until insulating regions 5 have been reached. As an example, the thickness of substrate 3 remaining after the thinning ranges from 1 to 10 μm. Substrate portions 3a, 3b are then totally insulated from one another by insulating regions 5. In operation, the biasing of substrate portions 3a and 3b to a common reference voltage is provided via contacting areas 11.

After the thinning, a step of implantation of dopant elements from the rear surface of substrate 3 is provided, to form a layer 15 of same conductivity type as the substrate but of higher doping level. Layer 15 extends from the thinned surface (rear surface) of the substrate, across a thickness ranging from 50 to 200 nm. It has the function of limiting dark currents due to the inevitable presence of crystal defects at the level of the rear surface of substrate portions 3a, 3b. Layer 15 is discontinuous, and stops at the level of insulating regions 5.

After the forming of layer 15, a laser surface anneal of the rear surface of the substrate is provided to stabilize this surface. A thin insulating layer 17, for example, a silicon oxide layer with a thickness of a few nanometers, is then formed on the rear surface of substrate 3. Layer 17 is itself coated with an antireflection layer 19, for example formed of a stack of several transparent dielectric layers of different indexes. Antireflection layer 19 is topped with juxtaposed color filtering elements, altogether forming a layer 21. In the shown example, a first substrate portion 3a containing a first photodiode is topped with a green filtering element (G) and a second substrate portion 3a containing a second photodiode is topped with a blue filtering element (B). Microlenses 23 are formed on top of filtering layer 21, in front of substrate portions 3a.

A first disadvantage of this type of sensor is the need to provide an implantation of dopant elements from the rear surface of the substrate after the thinning step, to form layer 15. At this stage of the manufacturing, the front surface of the sensor is already coated with a stack of insulating and metallic layers. There thus is a risk of contamination of the implantation equipment by the interconnection metals arranged on the front surface (for example, copper). In practice, this forces to use implantation equipment specifically dedicated to the forming of layer 15, separate from the equipment already provided to perform implantations from the front surface of the substrate.

Another disadvantage of such a sensor is the significant surface area taken up by biasing contacting areas 11 and by the corresponding silicon regions 13. The presence of such areas increases the total silicon surface area necessary to form the sensor. Further, the provision of contacting areas 11 and of the corresponding regions 13 in substrate portions 3a containing photodiodes tends to increase dark currents in the sensor.

SUMMARY

Thus, an embodiment aims at providing a method for forming a back-side illuminated image sensor, which at least partly overcomes some of the disadvantages of usual methods.

An embodiment aims at providing such a method enabling to do away with a step of implantation of dopant elements from the rear surface of the substrate.

Another embodiment aims at providing a back-side illuminated image sensor, which at least partly overcomes some of the disadvantages of usual sensors.

An embodiment aims at providing such a sensor having a decreased number of substrate biasing contacting areas with respect to usual sensors.

Thus, an embodiment provides a method for forming a back-side illuminated image sensor from a semiconductor substrate, this method comprising the steps of: a) forming, from the front surface of the substrate, areas of same conductivity type as the substrate but of higher doping level, extending deep under said front surface, these areas being bordered with insulating regions orthogonal to the front surface; b) thinning the substrate from the rear surface to the vicinity of these areas and all the way to the insulating regions; c) partially hollowing out the insulating regions on the rear surface side; and d) performing a laser surface anneal on the rear surface of the substrate.

According to an embodiment, at step a), the areas of same conductivity type as the substrate are formed by drive-in of dopant elements into the substrate, this drive-in being located between the insulating regions.

According to an embodiment, the insulating regions are trenches filled with insulator delimiting first substrate portion intended to comprise, above the areas of same conductivity type as the substrate, control transistors of the sensor, and second substrate portions, also delimited by insulating regions, are intended to comprise photodiodes.

According to an embodiment, the areas of same conductivity type as the substrate are made of polysilicon, step a) comprising the steps of: opening trenches from the front surface of the substrate extending, in depth, perpendicularly to the front surface; forming an insulating coating on the lateral walls of the trenches; and filling the trenches with polysilicon of same conductivity type as the substrate but of higher doping level.

According to an embodiment, after the opening of said trenches, a step of implantation of dopant elements from the internal walls of the trenches is further provided.

Another embodiment provides a back-side illuminated image sensor formed from a semiconductor substrate, wherein a layer of same conductivity type as the substrate but of higher doping level extends from the rear surface of the substrate, across a small thickness and over the entire rear surface of the sensor.

According to an embodiment, areas of same conductivity type as the substrate but of higher doping level, extend deep under the front surface of the sensor and all the way to the layer of small thickness, these areas being bordered with insulating regions orthogonal to the front surface.

According to an embodiment, the insulating regions extend perpendicularly from the front surface of the substrate to the layer of small thickness, and delimit first substrate portions, each containing one or several control transistors, and second substrate portions, each containing at least one photodiode.

According to an embodiment, first portions are in contact, by their front surfaces, with metallizations intended to provide both the biasing of these portions and that of the neighboring second portions.

According to an embodiment, neighboring substrate portions are separated by partitions each comprising two parallel insulating regions bordering a polysilicon area, and the areas of same conductivity type as the substrate are in contact, by their front surfaces, with metallizations intended to provide the substrate biasing.

According to an embodiment, the polysilicon is of the same conductivity type as the substrate and has a doping level from four to six times greater than the doping level of the layer of small thickness.

BRIEF DESCRIPTION OF THE DRAWINGS

The foregoing and other objects, features, and advantages will be discussed in detail in the following non-limiting description of specific embodiments in connection with the accompanying drawings.

DETAILED DESCRIPTION

Figure 1:
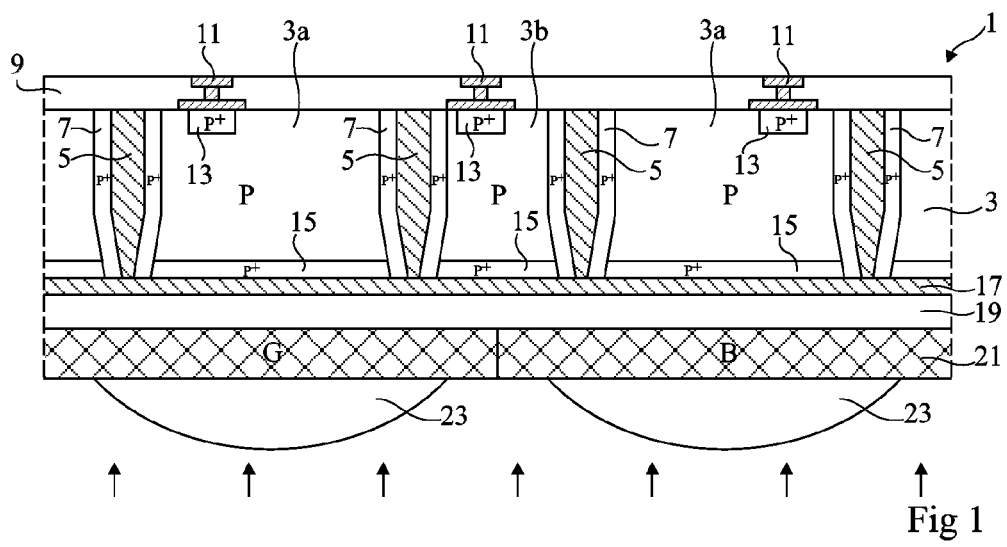
FIG. 1, previously described, is a cross-section view schematically and partially showing a back-side illuminated image sensor.

For clarity, the same elements have been designated with the same reference numerals in the different drawings and, further, as usual in the representation of integrated circuits, the various drawings are not to scale.

FIGS. 2A to 2D are cross-section views schematically and partially showing steps of a method for forming a back-side illuminated image sensor 31.

Figure 2A:
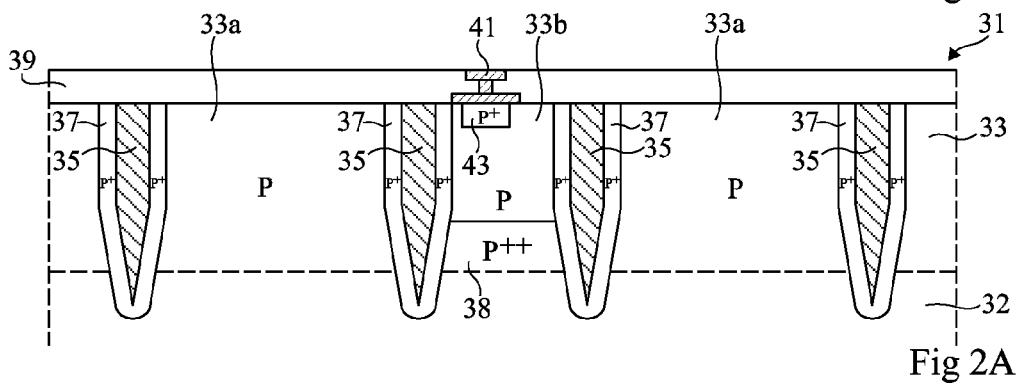
FIGS. 2A to 2D are cross-section views schematically and partially showing steps of a method for forming a back-side illuminated image sensor.

FIG. 2A illustrates the forming of various components of the sensor on the front surface side of a semiconductor substrate. "Semiconductor substrate" designates any type of substrate adapted to the forming of a back-side illuminated image sensor. In the present example, it is a solid silicon support 32 coated with a lightly-doped P-type epitaxial layer 33. Support 32 may have a thickness of a few hundreds of μm, for example, ranging between 500 and 800 μm, and epitaxial layer 33 may have a thickness of a few μm, for example, ranging between 1 and 10 μm. After a subsequent thinning step, only epitaxial layer 33 will remain. This layer thus forms the actual sensor substrate.

Before the thinning step, insulating regions 35, forming vertical partitions, are formed in the upper portion of the substrate. Regions 35 extend from the front surface of the substrate to and perpendicularly to this surface, down to an intermediary depth, for example, of a few micrometers. It should be noted that "perpendicularly" here means substantially perpendicularly, for example, forming an angle ranging between 70 and 120 degrees with the front surface. Actually, in this example, regions 35 have a pointed tapered shape. In the shown example, regions 35 totally cross epitaxial layer 33 and slightly extend into support 32. In top view (not shown), regions 35 delimit a plurality of substrate portions 33a and 33b, for example, rectangular. Each portion 33a is intended to comprise at least one photodiode and may comprise charge transfer devices (not shown), corresponding to a pixel of the sensor, and each portion 33b is intended to comprise one or several control transistors (not shown).

To form regions 35, trenches are opened in the substrate down to the desired depth, for example, by local etching, and filled with an insulating material such as silicon oxide. After the opening of the trenches but before their filling, an implantation of dopant elements may be performed from the internal trench walls, to create a thin layer 37 of same conductivity type as the substrate but of greater doping level at the interface between insulating material 35 and substrate 33. Layer 37 especially enables to limit dark currents capable of being generated at this interface.

In the lower portion of each substrate portion 33b, under the substrate portions intended to comprise one or several control transistors, an area 38 of same conductivity type as epitaxial layer 33 but of much higher doping level is formed. Area 38 is formed by local drive-in of dopant elements from the front surface of the substrate. It is bordered by insulating regions 35 which delimit region 33b. The implantation depth is selected to be such that after the substrate thinning, areas 38 are exposed on the rear surface side of the substrate, or are located in the immediate vicinity of this surface, for example, a few nanometers away.

After the forming of insulating regions 35 and of heavily-doped regions 38, photodiodes and charge transfer devices (not shown) are formed in substrate portions 33a, and control transistors (not shown) are formed inside and on top of substrate portions 33b, above areas 38.

The front surface of substrate 33 is then coated with a stack 39 of insulating and conductive layers in which the various sensor interconnections are formed. In particular, in the shown example, each substrate portion 33b has an associated biasing contacting area 41 formed in stack 39. Area 41 contacts a P-type region 43 of higher doping level than the substrate, formed at the surface of substrate portion 33b. The interconnection tracks and vias, other than those forming areas 41, have not been shown in FIGS. 2A to 2D.

Figure 2B:
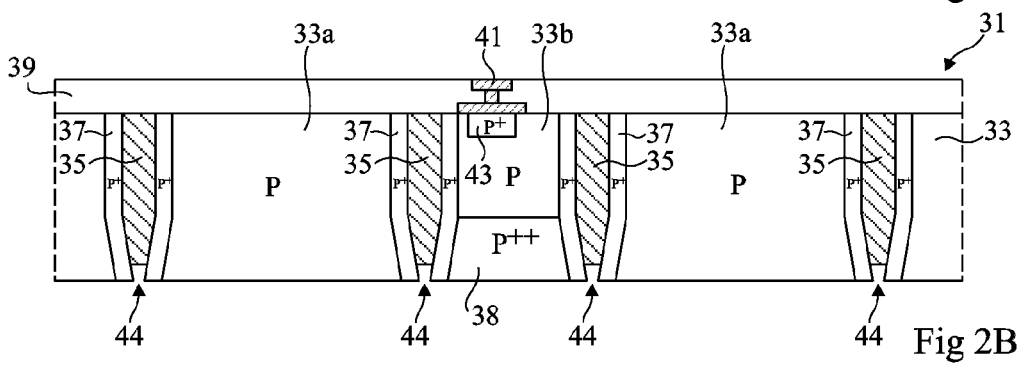

FIG. 2B illustrates the actual thinning step. After the forming of stack 39, a holding handle (not shown) is bonded to the front surface of the sensor, and the substrate is thinned from its rear surface to reach insulating regions 35. In this example, during the thinning, silicon support 32 is fully removed and only epitaxial layer 33 is maintained. Substrate portions 33a, 33b are then totally insulated from one another by insulating regions 35 which are exposed on the rear surface side of the thinned substrate. Areas 38 are exposed or are located in the immediate vicinity of this rear surface.

After the thinning, a step of partial hollowing of regions 35 from the rear surface of the substrate is provided. A solution adapted to selectively etching insulating material 35 over the semiconductor material of substrate 33 may be used for this purpose. Thus, at the level of the rear surface of each of regions 35, a recess 44, for example having a depth ranging between 10 and 100 nm, is formed.

Figure 2C:
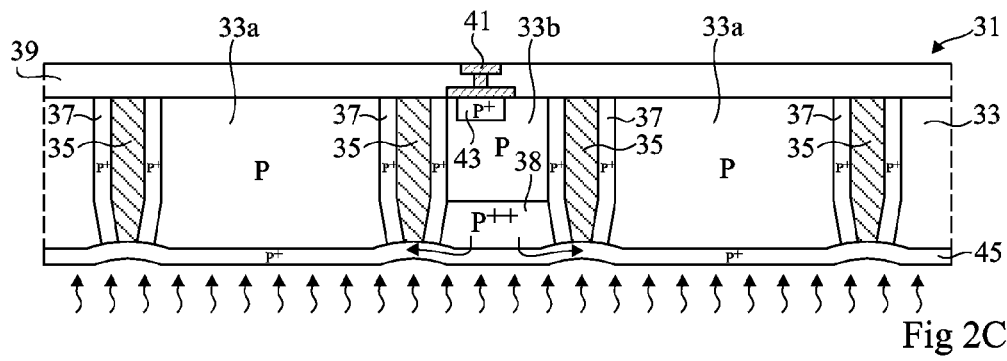

FIG. 2C illustrates a step of surface anneal of the rear surface of the substrate, by laser, subsequent to the forming of recesses 44. The laser anneal enables to very significantly raise the temperature of the rear surface, across a small thickness, while maintaining a low temperature in the upper portion of the substrate to avoid damaging the components already formed on the front surface side. As an example, during the anneal, the temperature of the rear surface of the substrate is raised up to more than 1400° C. across a thickness ranging from 50 to 150 nm, while a temperature substantially equal to the ambient temperature, for example, on the order of 25° C., is maintained in the upper portion of the substrate. During the anneal, a small substrate thickness liquefies on the rear surface side. This thickness especially includes the rear surface of areas 38. This results in a very fast diffusion of the dopant elements contained in areas 38, which distribute in a thin semiconductor layer 45 continuously extending over the entire rear surface of the sensor, and especially filling recesses 44. Layer 45, of greater doping level than the substrate, especially enables to limit dark currents due to the inevitable presence of crystal defects at the level of the rear surface of substrate portions 33a, 33b. The thickness of layer 45 especially depends on the setting of the laser equipment and on the duration of the anneal. As an example, it may range from 50 to 150 nm.

Figure 2D:
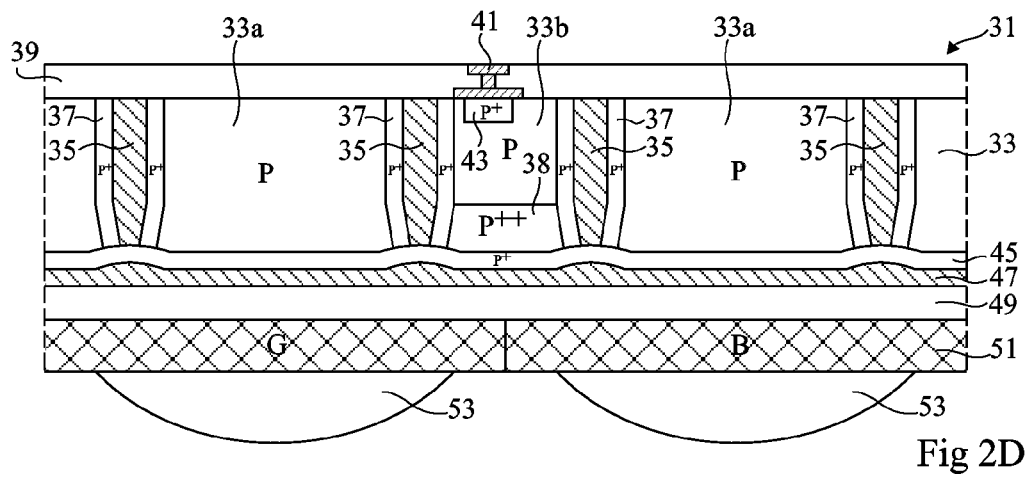

FIG. 2D illustrates final steps of the forming of sensor 31, corresponding to conventional steps of the forming of a back-side illuminated image sensor. A thin insulating layer 47 is formed on the rear surface of substrate 33 after the laser anneal step. Layer 47 is itself coated with an antireflection layer 49. Antireflection layer 49 is coated with juxtaposed color filtering elements G, B altogether forming a filtering layer 51. Microlenses 53 are to formed above filtering layer 51, in front of substrate portions 33a.

An advantage of the method described in relation with FIGS. 2A to 2D is that it enables to form, on the rear surface side of substrate 33, a layer 45 of the same conductivity type as the substrate but of higher doping level, without for all this to provide a step of implantation of dopant elements from the rear surface of the sensor.

Another advantage of sensors formed according to the provided method is that layer 45 is continuous, and in particular that it is not interrupted at the level of insulating regions 35. Layer 45 thus enables to provide a uniform biasing of all substrate portions 33a and 33b of the sensor, via the sole contacting areas 41 connected to substrate portions 33b. The absence of contacting areas at the level of substrate portions 33a enables to both decrease the bulk and decrease leakage currents.

It should be noted that the present invention is not limited to the specific example described in relation with FIGS. 2A to 2D. Various alterations, modifications, and improvements will occur to those skilled in the art.

In particular, it will be within the abilities of those skilled in the art to provide other distributions of the biasing contacting areas than that provided.

Further, in the above-described example, areas 38, formed by drive-in from the front surface of the substrate, will be formed immediately after insulating regions 35. Those skilled in the art may decide to form areas 38 at any other time of the manufacturing process. It is however preferable to form these areas relatively early in the process, to avoid for the implantation to damage components already formed in the upper portion of the substrate.

Further, embodiments are not limited to the above-described example where areas 38 are formed under substrate portions 33b containing control transistors. Those skilled in the art may form areas 38 at any other adapted location. The location provided in the example described in relation with FIGS. 2A to 2D however has the advantage of avoiding the diffusion of dopant elements to substrate portions 33a containing photodiodes, which could adversely affect the sensor performance.

The doping level of areas 38 is selected according to the doping level desired for layer 45. As an example, areas 38 may be doped to a level approximately from four to six times greater than the desired doping level of layer 45. For example, if a layer 45 having a doping level on the order of $5 \times 10^{17}$ atoms/cm$^3$ is desired to be formed, a doping level on the order of $2 \times 10^{18}$ atoms/cm$^3$ may be provided in areas 38.

FIGS. 3A to 3D are cross-section views schematically and partially showing steps of another embodiment of a method for forming a back-side illuminated image sensor 61. The method of FIGS. 3A to 3D differs from the method of FIGS.

2A to 2D essentially by the nature of the source of dopant elements used to form, during the laser anneal, a layer of high doping level on the rear surface of the sensor. This method especially enables to further decrease the bulk associated with the biasing contacting areas with respect to the method described in relation with FIGS. 2A to 2D. The elements common with the method described in relation with FIGS. 2A to 2D will only be shortly described hereafter.

Figure 3A:
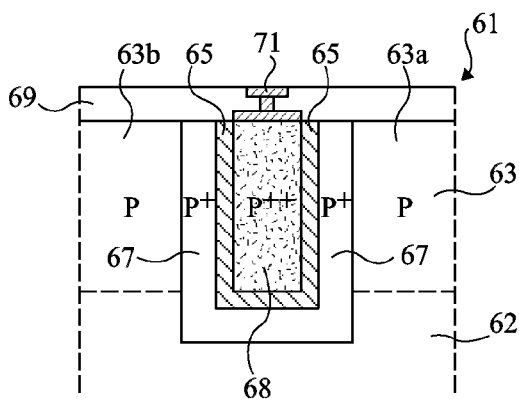
FIGS. 3A to 3D are cross-section views schematically and partially showing steps of another embodiment of a method for forming a back-side illuminated image sensor.

FIG. 3A illustrates the forming of various components on the front surface side of the sensor, before the substrate thinning step. In this example, it is started from a solid silicon substrate 62 coated with a lightly-doped P-type epitaxial layer 63.

Insulating regions 65, orthogonal to the front surface, are formed in the upper portion of the substrate. Unlike regions 35 of the method described in relation with FIGS. 2A to 2D, regions 65 are not partitions entirely filled with an insulating material, but are formed by the insulating coating of partitions having their core 68 made of heavily-doped P-type polysilicon.

In the shown example, regions 65 thoroughly cross epitaxial layer 63 and slightly extend into support 62. In top view, the partitions formed by insulating regions 65 and by intermediary areas 68 delimit a plurality of substrate portions 63a and 63b. Each portion 63a is intended to comprise at least one photodiode and may comprise charge transfer devices, and each portion 63b is intended to comprise one or several control transistors.

To form regions 65 and areas 68, trenches are opened in the substrate down to the desired depth. The lateral walls and the bottom of these trenches are coated with an insulating material such as silicon oxide, after which the trenches are filled with heavily-doped P-type polysilicon. After the opening, but before the deposition of coating 65, dopant elements may be implanted from the internal walls of the trenches, to create, at the interface between the insulating material and the substrate, a thin layer 67 of same conductivity type as the substrate but of higher doping level. Layer 67 especially enables to limit dark currents that may be generated at the interface between the insulating material and the substrate.

After the forming of regions 65 and of areas 68, photodiodes and charge transfer devices (not shown) are formed in substrate portions 63a, and control transistors (not shown) are formed inside and on top of substrate portions 63b. The front surface of substrate 63 is then covered with a stack 69 of insulating and conductive layers where the various sensor interconnections are formed. In particular, in the shown example, the front surface of each polysilicon area 68 is contacted by an area 71 formed in stack 69.

Figure 3B:
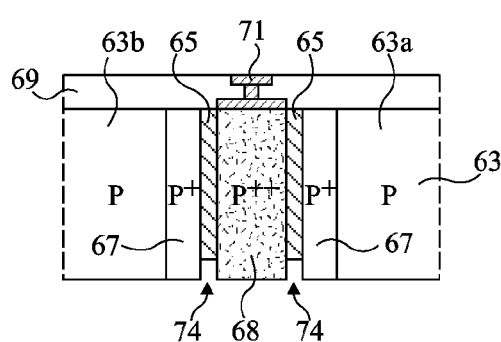

FIG. 3B illustrates a step of thinning of the substrate from its rear surface, to reach polysilicon areas 68. At this stage, substrate portions 63a, 63b are totally insulated from one another by insulating regions 65 which are exposed on the rear surface side of the thinned substrate. In particular, neighboring substrate portions 63a and/or 63b are separated by a partition comprising two parallel insulating regions 65 bordering a polysilicon area 68.

After the thinning, a step of partial hollowing of regions 65 from the rear surface of the substrate is provided. A solution adapted to selectively etching insulating material 65 over the material of substrate 63 and polysilicon 68 may be used for this purpose. Thus, at the rear surface level of each of regions 65, a recess 74, for example having a depth ranging between 10 and 100 nm, is formed.

Figure 3C:
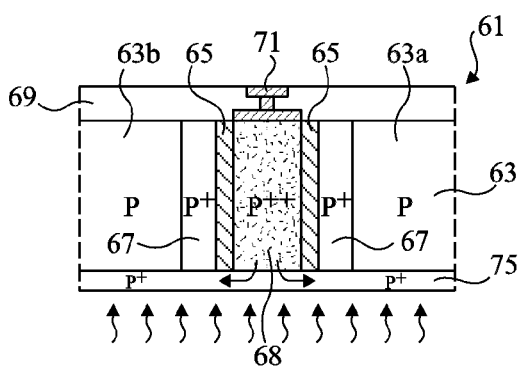

FIG. 3C illustrates a step of laser surface anneal of the rear surface of the substrate. During the anneal, a small substrate thickness liquefies on the rear surface side. In particular, the lower portion of areas 68, which are very heavily doped, melts. This results in a very fast diffusion of the dopant elements contained in areas 68, which distribute over a thin semiconductor strip 75 continuously extending across the entire rear surface of the sensor, and especially filling recesses 74. Layer 75, of higher doping level than the substrate, especially enables to limit dark currents due to the inevitable presence of crystal defects at the level of the rear surface of the sensor.

Figure 3D:
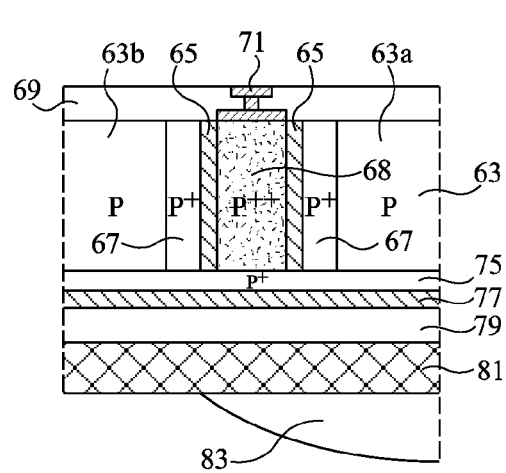

FIG. 3D illustrates final steps of the forming of sensor 61, corresponding to conventional steps of the forming of a backside illuminated image sensor. A thin insulating layer 77 is formed on the rear surface side of substrate 63. Layer 77 is itself coated with an antireflection layer 79. Antireflection layer 79 is topped with a filtering layer 81. Microlenses 83 are formed above filtering layer 81, in front of substrate portions 63a.

This embodiment has the same advantages as the embodiment described in relation with FIGS. 2A to 2D, and further has the advantage that it is no longer necessary to provide biasing contacting areas in substrate portions 63b comprising control transistors. Indeed, areas 71 enable to ensure the biasing of layer 75, and thus of substrate portions 63a and 63b. Further, it is not necessary to provide a drive-in of doped elements from the front surface of the substrate.

Such alterations, modifications, and improvements are intended to be part of this disclosure, and are intended to be within the spirit and the scope of the present invention. Accordingly, the foregoing description is by way of example only and is not intended to be limiting. The present invention is limited only as defined in the following claims and the to equivalents thereto.

What is claimed is:

1. A method for forming a back-side illuminated image sensor from a semiconductor substrate, this method comprising the steps of:
    a) forming, from the front surface of the substrate, areas of same conductivity type as the substrate but of higher doping level, extending deep under said front surface, these areas being bordered with insulating regions orthogonal to the front surface;
    b) thinning the substrate from the rear surface to the vicinity of these areas and all the way to the insulating regions;
    c) partially hollowing out the insulating regions on the rear surface side; and
    d) performing a laser surface anneal on the rear surface of the substrate.

2. The method of claim 1, wherein, at step a), said areas are formed by drive-in of dopant elements into the substrate, this drive-in being located between said insulating regions.

3. The method of claim 2, wherein:
    said insulating regions are trenches filled with insulator delimiting first substrate portions intended to comprise, above said areas, control transistors of the sensor; and
    second substrate portions, also delimited by insulating regions, are intended to comprise photodiodes.

4. The method of claim 1, wherein said areas are made of polysilicon, step a) comprising the steps of:
    opening trenches from the front surface of the substrate extending, in depth, perpendicularly to said front surface;
    forming an insulating coating on the lateral walls of the trenches; and
    filling the trenches with polysilicon of same conductivity type as the substrate but of higher doping level.

5. The method of claim 3, further comprising, after the opening of said trenches, a step of implantation of dopant elements from the internal walls of the trenches.

6. The method of claim 1, further comprising forming, subsequent to step a), a layer of same conductivity type as the substrate but of higher doping level across a small thickness and over the entire rear surface of the sensor.

7. The method of claim 1, further comprising maintaining, during the laser surface anneal, a low temperature in an upper portion of the substrate.

8. The method of claim 1, further comprising liquefying a small substrate thickness including the areas of same conductivity type as the substrate but of higher doping level.

9. The method of claim 1, further comprising causing dopant elements to be diffused in a thin layer extending across a small thickness and over the entire rear surface of the sensor.

10. The method of claim 9, further comprising causing dopant elements to be diffused into the partially hollowed out insulating regions on the rear surface side.

11. The method of claim 3, further comprising forming metallizations intended to provide both the biasing of the first substrate portions and that of the second substrate portions.

* * * * *

UNITED STATES PATENT AND TRADEMARK OFFICE
CERTIFICATE OF CORRECTION

PATENT NO. : 8,735,208 B2  
APPLICATION NO. : 13/445265  
DATED : May 27, 2014  
INVENTOR(S) : François Roy et al.

Page 1 of 1

It is certified that error appears in the above-identified patent and that said Letters Patent is hereby corrected as shown below:

On the title page, item (57) in the Abstract line 10, delete the word "to".

In the Specification:

At column 1, line 61, delete the first instance of the word "to".

At column 4, line 52, delete the first instance of the word "to".

At column 6, line 16, delete the word "to".

At column 8, line 31, delete the word "to".

Signed and Sealed this  
Twenty-sixth Day of August, 2014

Michelle K. Lee  
*Deputy Director of the United States Patent and Trademark Office*